United States Patent
Chen et al.

(10) Patent No.: US 6,235,647 B1
(45) Date of Patent: May 22, 2001

(54) DEPOSITION PROCESS FOR FORMING VOID-FREE DIELECTRIC LAYER

(75) Inventors: I. T. Chen, Taipie; Horng-Bor Lu, Hsinchu, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/352,578

(22) Filed: Jul. 13, 1999

(51) Int. Cl.$^7$ .................................................. H01L 21/31
(52) U.S. Cl. .................. 438/778; 438/788; 427/569; 427/579; 427/585
(58) Field of Search .................. 427/569, 570, 427/574, 579, 585, 587, 588, 96, 99, 255.15, 255.18, 255.28, 255.29, 255.36, 255.7; 438/778, 787–789

(56) References Cited

U.S. PATENT DOCUMENTS 5,968,610 * 10/1999 Liu et al. .............................. 427/579
6,077,784 * 6/2000 Wu et al. .............................. 438/691

* cited by examiner

*Primary Examiner*—Robert Kunemund
*Assistant Examiner*—Donald L. Champagne
(74) *Attorney, Agent, or Firm*—Martine Penilla & Kim, LLP

(57) ABSTRACT

A deposition process for forming a void-free dielectric layer is described. A first dielectric layer 204 is formed over a conductor pattern 202. A second dielectric layer 206 is formed to conform to the first dielectric layer. A third dielectric layer 208 is formed to cover the second dielectric layer. The first, second, and third dielectric layers can be formed by high density plasma deposition, atmospheric pressure deposition, and plasma enhanced deposition, respectively. The second dielectric layer can alternatively be formed by plasma enhanced deposition.

19 Claims, 2 Drawing Sheets

DEPOSITION PROCESS FOR FORMING VOID-FREE DIELECTRIC LAYER

BACKGROUND OF THE INVENTION

1. Field of Invention

The present invention relates to a semiconductor process. More particularly, the present invention relates to a method for forming a void-free dielectric layer.

2. Description of Related Art

FIG. 1 is a schematic, cross-sectional view of a conventional deposition process. As shown in FIG. 1, a substrate 100 and a metal pattern 102 over the substrate 100 are provided, and they are covered with a high density plasma (HDP) dielectric layer 104. The HDP dielectric layer 104 often has several sharp corners 105 on its surface over the metal pattern 102.

Still referring to FIG. 1, a deposition layer 106 is formed over the HDP dielectric layer 104. The deposition layer 106 is conventionally made of a low-cost material, such as a silane-based ($SiH_4$-based) material. However, the $SiH_4$-based material has poor step coverage on the sharp corners 105, and therefore has voids 120 therein after it is deposited over the HDP dielectric layer 104. The voids 120 are easily exposed and filled with polishing slurry in the following chemical-mechanical polishing step. This polishing slurry in the voids affects the electricity, yield and reliability of the deposition layer 106.

Moreover, in the following via process, the voids 120 are defect sources on the vertical sidewall of the via hole. Those defects on the sidewalls often induce 'volcanoes' when a tungsten plug is formed on a barrier layer over the via hole. The volcanoes, which are rapid reactions between the titanium (Ti) barrier layer and tungsten fluoride ($WF_6$, a tungsten plug material source), often cause via hole failures in the via process.

Although forming the deposition layer from a material with good step coverage inhibits void formation, it costs much more than forming the deposition layer from a $SiH_4$-based material.

Forming the deposition layer by high density plasma (HDP) deposition also inhibits void formation. However, the HDP deposition is a high-cost technique, and is also a technique that easily charge damages the underlying features on the substrate.

SUMMARY OF THE INVENTION

The invention provides a deposition process. The process comprises high-density-plasma depositing a first dielectric layer on a conductor pattern, depositing a second dielectric layer conformal to the first conductor layer, and depositing a third dielectric layer on the second dielectric layer. In this process, the first, second, and third dielectric layers can be formed by high density plasma deposition, atmospheric pressure deposition, and plasma enhanced deposition, respectively. The second dielectric layer can be alternatively formed by plasma enhanced deposition.

Moreover, the second dielectric layer is preferably made of a tetraethosiloxane-based (TEOS-based) material, and is preferably formed to a thickness of about 500 angstroms to about 2000 angstroms.

The conformal second dielectric layer moderates the sharp topograph of the first dielectric layer formed by HDPCVD, and thus inhibits void formation when depositing the third dielectric layer thereon. Without voids, problems stemming from the voids such as slurry effects or via hole failures are solved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
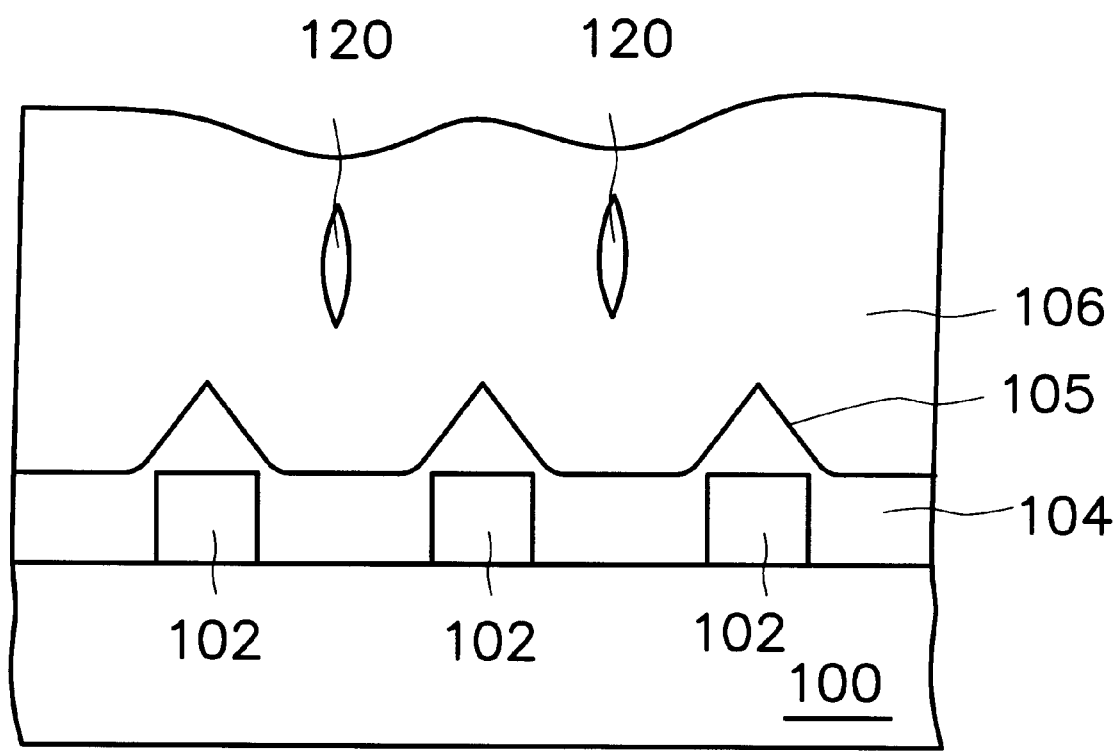
FIG. 1 is a schematic, cross-sectional view of a conventional deposition process.
Figure 2A:
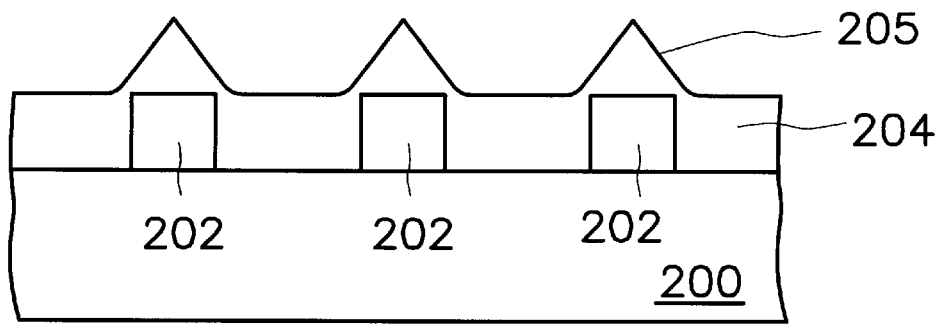
FIGS. 2A, 2B and 2C are schematic, cross-sectional views of a deposition process according to one preferred embodiment of this invention.
Figure 2B:
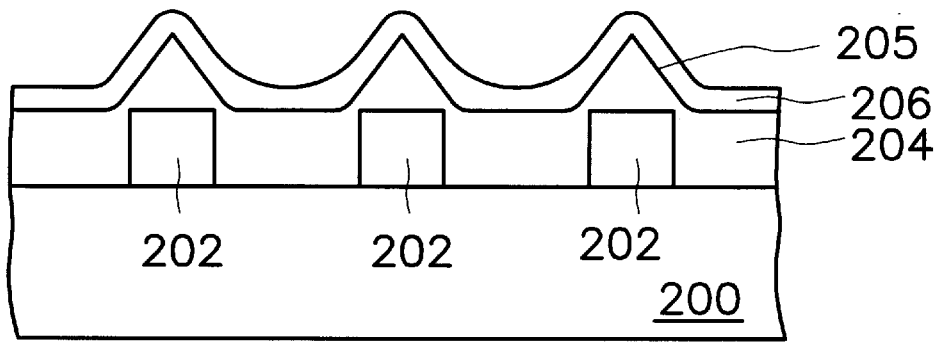
Figure 2C:
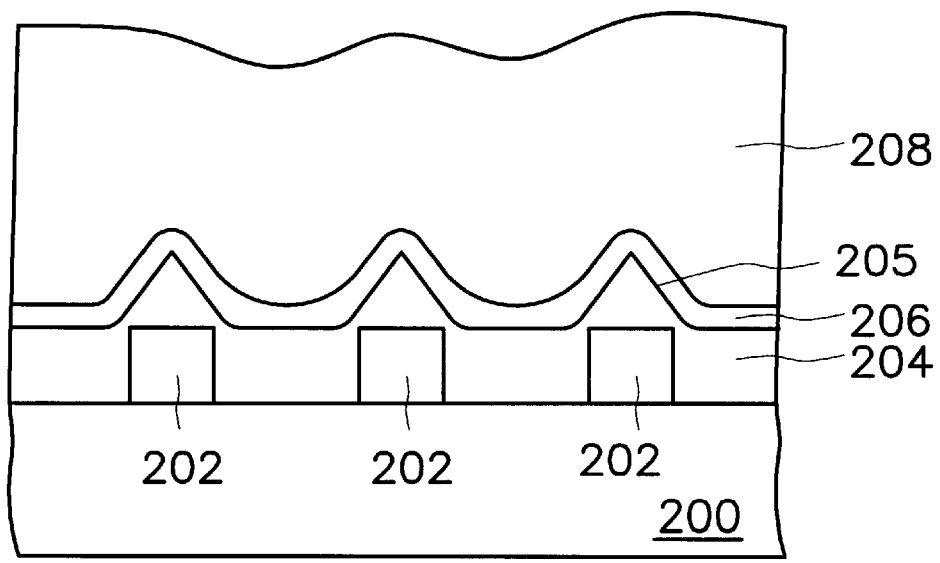

FIGS. 2A–2C are schematic, cross-sectional views of a deposition process according to one preferred embodiment of this invention. The deposition process comprises the steps of forming a first dielectric layer over a conductor pattern, forming a second dielectric layer conforming to the first dielectric layer, and forming a third dielectric layer covering the second dielectric layer.

As shown in FIG. 2A, a substrate 200 and a conductor pattern 202 over the substrate 200 are provided. A first dielectric layer 204, such as silicon oxide layer, is formed to cover the conductor pattern 202 over the substrate 200 by high density plasma (HDP) deposition. The first dielectric layer 204 often has several sharp corners 205 on its surface over the conductor pattern 202.

As shown in FIG. 2B, a second dielectric layer 206 is formed over the first dielectric layer 204. The second dielectric layer 206 is conformal to the first dielectric layer 204, and therefore moderates the sharpness of the corners 205 on the first dielectric layer 204.

The second dielectric layer 206, with a thickness of about 500 to about 2000 angstroms, can be formed in a low temperature deposition of silicon oxide. This deposition can be carried out in an atmospheric pressure chemical vapor deposition (APCVD) reactor or in a plasma enhanced chemical vapor deposition (PECVD) reactor. In each of those reactors, silicon oxide is deposited by, for example, decomposing tetraethosiloxane, $Si(OC_2H_5)_4$, also known as TEOS. Because of rapid surface migration, this silicon oxide layer prepared by TEOS decomposition under APCVD or PECVD conditions exhibits nearly conformal coverage. Such silicon oxide layer with good conformability has an equal thickness over the first dielectric layer regardless of its slope (i.e. vertical and horizontal surfaces are covered with an equal thickness). Preferably, the silicon oxide layer has a thickness of about 1000 angstroms.

As shown in FIG. 2C, a third dielectric layer 208 is formed over the second dielectric layer 206. Since the sharpness of the corners 205 are moderated by conformally forming the second dielectric layer 206 over the first dielectric layer 204, the third dielectric layer 208 can be made of a material with poor step coverage. This material with poor step coverage, such as silane-based ($SiH_4$-based) material, can be deposited by a plasma enhanced deposition technique. The $SiH_4$-based material is a preferable material for the third dielectric layer because it has a high deposition rate.

The third dielectric layer is not limited to a material with poor step coverage. In other words, other materials with excellent step coverage are also applicable materials for the third dielectric layer. However, the material with poor step coverage, such as a silane-based ($SiH_4$-based) material, is preferable because it is a low-cost material.

Moreover, when compared with a high density plasma deposition technique, an atmospheric pressure deposition technique and a plasma enhanced deposition technique are both low-cost techniques. This present invention uses such atmospheric pressure deposition and plasma enhanced deposition techniques to form films over the HDP dielectric layer, and is therefore an economical method for forming a void-free dielectric layer.

The previously described versions of the present invention have many advantages, comprising:

1. The conformal second dielectric layer inhibits void formation when depositing the third dielectric layer thereon. Without voids, problems stemming from the voids such as slurry effects or via hole failures are solved.
2. The second dielectric layer and the third dielectric layer are formed by atmospheric pressure deposition or plasma enhanced deposition, rather than by high density plasma deposition, thereby preventing the underlying features from being charge damaged on the substrate.
3. The invention economically solves the void problems because the invention uses atmospheric pressure deposition and plasma enhanced deposition techniques which are both more economical than high density plasma deposition, and because the third dielectric layer can be made of a low-cost material such as silane-based ($SiH_4$-based) material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A deposition process, comprising:

providing a conductor pattern;

forming a high density plasma (HDP) dielectric layer over the conductor pattern;

forming a tetraethosiloxane-based (TEOS-based) material layer conformal to the HDP dielectric layer; and forming a silane-based ($SiH_4$-based) material layer over the TEOS-based material layer.

2. The process of claim 1, wherein the TEOS-based material layer is formed by low temperature atmospheric pressure deposition.

3. The process of claim 1, wherein the TEOS-based material layer is formed by plasma enhanced deposition.

4. The process of claim 1, wherein the TEOS-based material layer has a thickness of about 500 angstroms to about 2000 angstroms.

5. The process of claim 4, wherein the TEOS-based material layer has a thickness of about 1000 angstroms.

6. The process of claim 1, wherein the $SiH_4$-based material layer is formed by plasma enhanced deposition.

7. A deposition process for forming a void-free dielectric layer, comprising:

forming a high density plasma (HDP) dielectric layer by HDP deposition, wherein the HDP dielectric layer has a plurality of sharp corners thereon;

forming a conformal dielectric layer over the HDP dielectric layer, thereby moderating the sharp corners on the HDP dielectric layer; and forming a dielectric layer over the conformal dielectric layer by plasma enhanced deposition.

8. The process of claim 7, wherein the conformal dielectric layer is formed by low temperature atmospheric pressure deposition.

9. The process of claim 7, wherein the conformal dielectric layer is formed by plasma enhanced deposition.

10. The process of claim 7, wherein the conformal dielectric layer is made of a tetraethosiloxane-based (TEOS-based) material.

11. The process of claim 7, wherein the conformal dielectric layer has a thickness of about 500 angstroms to about 2000 angstroms.

12. The process of claim 11, wherein the conformal dielectric layer has a thickness of about 1000 angstroms.

13. The process of claim 7, wherein the dielectric layer is made of a silane-based ($SiH_4$-based) material.

14. A process for forming films over a conductor pattern, comprising:

a first deposition step for high-density-plasma depositing a first dielectric layer on the conductor pattern;

a second deposition step for depositing a second dielectric layer conforming to the first dielectric layer, the second dielectric layer having a thickness of about 500 angstroms to about 2,000 angstroms; and a third deposition step for depositing a third dielectric layer on the second dielectric layer.

15. The process of claim 14, wherein the second deposition step is performed in an APCVD reactor.

16. The process of claim 14, wherein the second deposition step is performed in a PECVD reactor.

17. The process of claim 14, wherein the third deposition step is performed in a PECVD reactor.

18. The process of claim 14, wherein the second dielectric layer is made of a tetraethosiloxane-based (TEOS-based) material.

19. The process of claim 14, wherein the third dielectric layer is made of a silane-based ($SiH_4$-based) material.

* * * * *